United States Patent [19]
Horie et al.

[11] Patent Number: 5,838,028
[45] Date of Patent: Nov. 17, 1998

[54] SEMICONDUCTOR DEVICE HAVING A RIDGE OR GROOVE

[75] Inventors: Hideyoshi Horie; Toshinari Fujimori; Satoru Nagao; Hideki Gotoh, all of Ushiku, Japan

[73] Assignee: Mitsubishi Chemical Corporation, Tokyo, Japan

[21] Appl. No.: 861,640

[22] Filed: May 22, 1997

Related U.S. Application Data

[63] Continuation of Ser. No. 498,127, Jul. 5, 1995, abandoned.

[30] Foreign Application Priority Data

| Jul. 4, 1994 | [JP] | Japan | 6-152126 |
| Sep. 6, 1994 | [JP] | Japan | 6-212803 |

[51] Int. Cl.$^6$ .......................... H01S 3/19; H01L 31/038; H01L 31/0336; H01L 31/072
[52] U.S. Cl. ......................... 257/183; 372/45; 372/46
[58] Field of Search ............................ 257/183, 85, 13, 257/18, 918; 372/46, 45

[56] References Cited

U.S. PATENT DOCUMENTS

| 5,155,738 | 10/1992 | Ijichi et al. ......................... | 257/18 |
| 5,255,279 | 10/1993 | Takahashi et al. ................... | 372/46 |
| 5,357,535 | 10/1994 | Shima et al. ......................... | 372/46 |
| 5,386,428 | 1/1995 | Thornton et al. ..................... | 372/50 |
| 5,446,753 | 8/1995 | Yoshida ............................... | 372/45 |

FOREIGN PATENT DOCUMENTS

| 0 452 146 A1 | 10/1991 | European Pat. Off. . |
| 526128 A2 | 2/1993 | European Pat. Off. . |
| 63-19824 | 1/1988 | Japan . |
| 1-304793 | 12/1989 | Japan . |
| 5-259574 | 10/1993 | Japan . |
| 5-304336 | 11/1993 | Japan . |

*Primary Examiner*—Tom Thomas
*Assistant Examiner*—Adriana Giordana
*Attorney, Agent, or Firm*—Armstrong, Westerman, Hattori, McLeland & Naughton

[57] ABSTRACT

The invention provides a semiconductor device having a structure wherein a layer comprising at least $Al_wGa_{1-w}As$ is formed on a substrate and a second etching stop layer, a first etching stop layer and a layer comprising $Al_yGa_{1-y}As$ are deposited on the layer comprising $Al_wGa_{1-w}As$ in the described order, with a portion of the layer comprising $Al_yG_{1-y}As$ and a portion of the first etching stop layer being removed. This structure enables a desired ridge shape to be fabricated with good quality and allows for free selection of the Al mixed crystal ratio of the layer to be etched, and makes it possible to form the re-growth interface of GaAs. Thus, the qualty of crystal of the re-grown portion can be improved.

4 Claims, 12 Drawing Sheets

SEMICONDUCTOR DEVICE HAVING A RIDGE OR GROOVE

This application is a continuation of application Ser. No. 08/498,127 filed Jul. 5, 1995, now abandoned.

BACKGROUND OF THE INVENTION

The present invention relates generally to a semiconductor device and its fabrication process, and more specifically to a semiconductor device having a ridge or groove formed by making use of an etching stop layer and its fabrication process.

Ridged or grooved semiconductor devices are fabricated by etching away a portion of an upper clad layer located above an active layer. Such semiconductor devices may be fabricated, with high reproducibility, by locating an etching stop layer between an active layer and an upper clad layer. These semiconductor devices are primarily suitable for use as optical devices.

In a conventional process so far known to form ridges or grooves, AlGaAs with an Al concentration of about 0.5 or more is etched by using hot hydrochloric acid, etc., as an etchant, while GaAs is used as an etching stop layer.

As proposed in JP-A 5(1993)-259574, on the other hand, there is available a semiconductor light emitting device fabricated by making use of an etching stop layer, in which a first conduction type substrate has thereon a first conduction type of lower clad layer, an active layer, a second conduction type of first upper clad layer comprising $Al_xGa_{1-x}As$, a second conduction type of etching stop layer comprising $Al_YGa_{1-Y}As$ and a second conduction type of second upper clad layer comprising $Al_ZGa_{1-Z}As$ in the described order, with the first upper clad layer having a mixed crystal ratio X of 0.38 to 0.6, the etching stop layer having an Y of at least 0.6, and the second upper clad layer having an Z of 0.38 to 0.6. The formation of precisely shaped ridges or grooves may be achieved by dry etching techniques.

However, the above-described process has a number of difficulties.

JP-A 5-259574 mentioned just above discloses a process for the fabrication of a semiconductor optical device, which makes use of the resistance of AlGaAs having an Al concentration of at least 0.6 to an aqueous etchant of an organic acid and hydrogen peroxide, and involves the step of treating the second upper clad layer with this wet etchant to form a ridge.

A problem with this process is, however, that AlGaAs having an Al concentration of at least 0.6, which is susceptible to oxidation, remains on the surface where regrowth is to be performed, and the resulting epitaxial layer contains much defects.

The desired ridge shape may prima facie be obtained by the dry etching techniques. However, the dry etching techniques are less suitable for optical semiconductor device fabrication, because crystal defects are likely to occur.

It is thus demanded to achieve an etching stop layer that enables the desired ridge shape to be produced with good quality and allow for free selection of the Al concentration of the layer to be etched.

SUMMARY OF THE INVENTION

An object of the present invention is to exploit the diversity of an optical semiconductor device with a ridge or groove current injection area.

Another object of the present invention is to provide a process for wet etching a layer comprising $Al_YGa_{1-Y}As$ having any desired Al concentration for the precise formation of a ridge or groove having any desired shape, and to provide a semiconductor device fabricated by using such a process.

More specifically, the present invention provides a semiconductor device having a layer comprising at least $Al_WGa_{1-W}As$ above a substrate and having a second etching stop layer, a first etching stop layer and a layer comprising $Al_YGa_{1-Y}As$ grown on the layer comprising $Al_WGa_{1-W}As$ in the described order, characterized in that a portion of said layer comprising $Al_YGa_{1-Y}As$ and a portion of said first etching stop layer are removed.

The semiconductor device of the present invention is also characterized in that the second etching stop layer comprises GaAs and the first etching stop layer comprises $Al_XGa_{1-X}As$, and by conforming to the following condition:

$$X-Y \geq 0.1$$

Moreover, the semiconductor device of the present invention is characterized in that the second etching stop layer comprises $Al_ZGa_{1-Z}As$ or GaAs and said first etching stop layer comprises $In_VGa_{1-V}P$.

The process for semiconductor device fabrication according to the present invention is characterized by involving the steps of forming a layer comprising at least $Al_WGa_{1-W}As$ on the substrate and growing a second etching stop layer, a first etching stop layer and a layer comprising $Al_YGa_{1-Y}As$ on said layer comprising $Al_WGa_{1-W}As$ in the described order by a epitaxial growth technique, and of etching away a portion of said layer comprising $Al_YGa_{1-Y}As$ using said first etching stop layer as an etching stop layer and then etching away a portion of said first etching stop layer using said second etching stop layer as an etching stop layer, thereby forming a ridge or groove.

The process for semiconductor device fabrication according to the present invention is also characterized in that the second etching stop layer comprises GaAs and the first etching layer comprises $Al_XGa_{1-X}As$.

The process for semiconductor device fabrication according to the present invention is further characterized in that the second etching stop layer comprises $Al_ZGa_{1-Z}As$ or GaAs and the first etching stop layer comprises $In_VGa_{1-V}P$.

DESCRIPTION OF THE PREFERRED EMBODIMENT

The process of the present invention may be applied to optical semiconductor devices such as FETs and HBTs, but is preferably applied to optical semiconductor devices, especially semiconductor laser diodes.

In the semiconductor device of the present invention, the substrate material is usually a so-called single crystalline wafer of the III–V group compounds. The wafer is obtained by the slicing of the III–V group single crystalline compounds, especially bulk crystals of compounds of the IIIb and Vb group elements in the periodic table. The substrate material used herein is a wafer selected from the group consisting of GaP, GaAs, and InP, among which GaAs is particularly preferred in view of lattice constant matching.

The semiconductor device of the present invention has a structure including a layer comprising at least $Al_WGa_{1-W}As$ on a substrate and having a second etching stop layer, a first etching stop layer and a layer comprising $Al_YGa_{1-Y}As$ grown on the layer comprising $Al_WGa_{1-W}As$ in the described order, with a portion of the layer comprising $Al_YGa_{1-Y}$ and a portion of the first etching stop layer being removed.

The semiconductor device of the present invention has preferably the second and first etching stop layers comprising GaAs and $Al_XGa_{1-X}As$, respectively, and conforms to the following condition:

$X-Y \geq 0.1$

Furthermore in the semiconductor device of the present invention, it is preferably that the second etching stop layer comprises $Al_ZGa_{1-Z}As$ or GaAs and the first etching stop layer comprises $In_VGa_{1-V}P$.

It is here to be noted that the removal of the etching stop layers is preferably achieved by wet etching.

Figure 1:
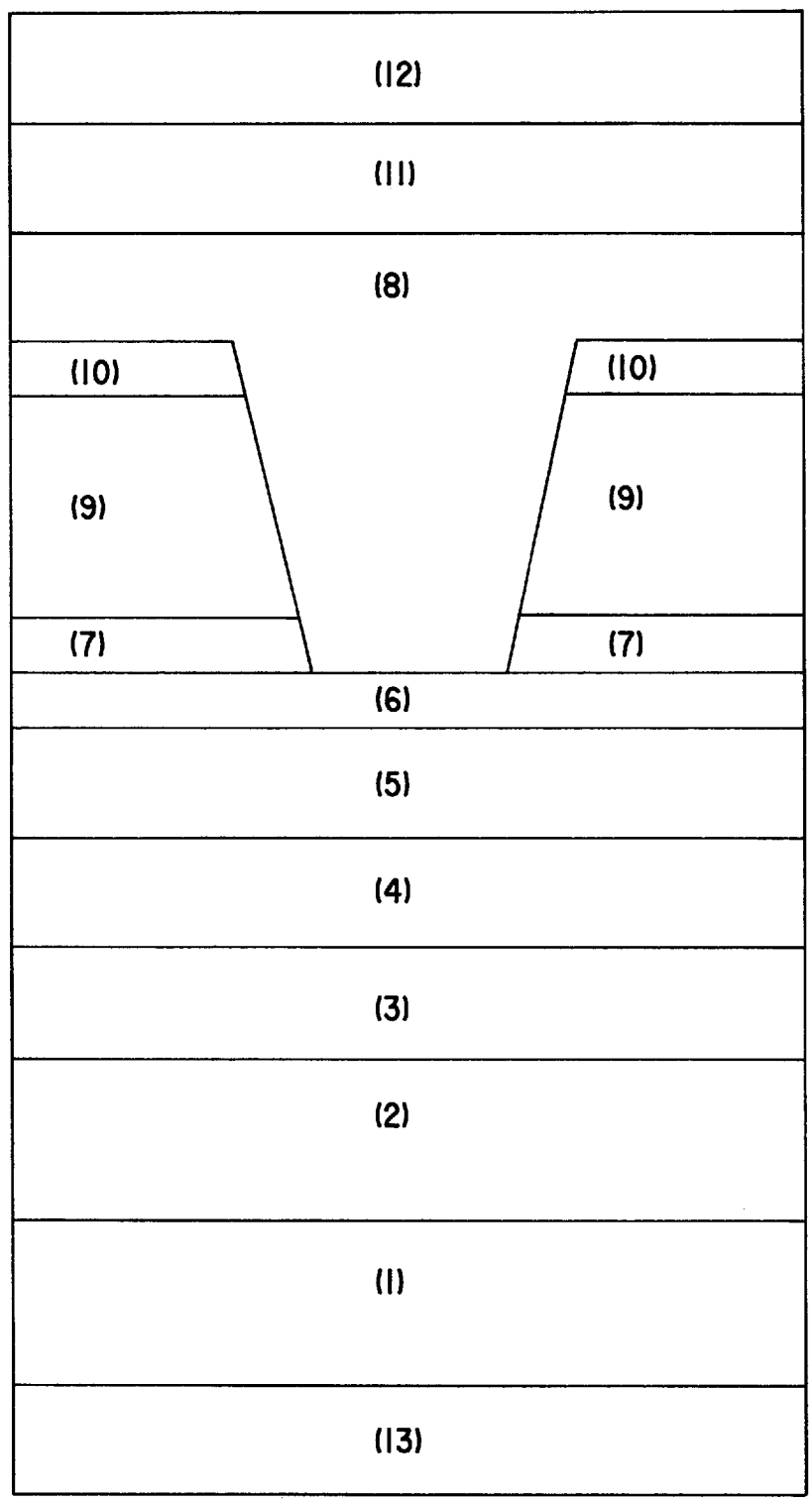
FIG. 1 is a schematic of one example of the grooved epitaxial structure for a semiconductor laser diode according to the present invention.
Figure 3:
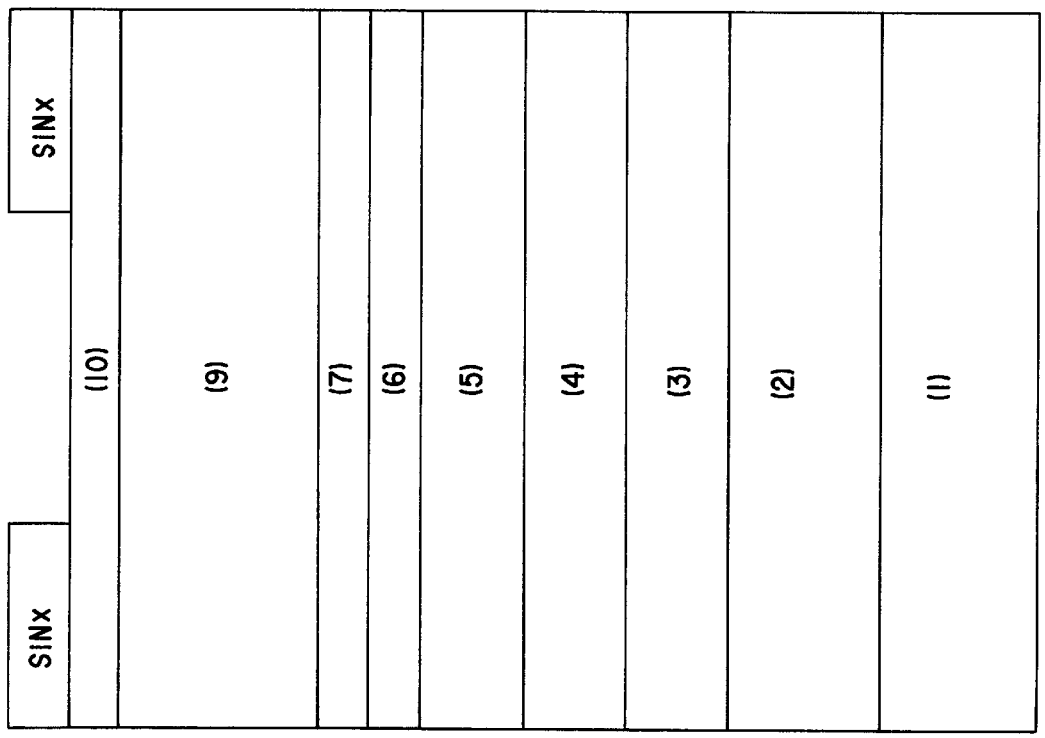
FIG. 3 is a schematic of the process for fabricating the semiconductor laser diode shown in FIG. 1.

FIG. 1 is a schematic of a semiconductor laser diode fabricated as an example of the epitaxial structure of the semiconductor device according to the present invention. In FIG. 1 reference numeral 1 represents a substrate; 2 a buffer layer; 3 a lower clad layer; 4 an active layer; 5 a first upper clad layer; 6 a second etching stop layer; 7 a first etching stop layer; 8 a second upper clad layer; 9 a current blocking layer; 10 a cap layer; 11 a contact layer; and 12 and 13 electrodes.

It is the first upper clad layer 5 that comprises $Al_WGa_{1-W}As$, and the current blocking layer 9 is a layer comprising $Al_YGa_{1-Y}As$. The respective layers of the semiconductor device according to the present invention are formed over the substrate in the form of epitaxial thin films.

A first upper clad layer 5 may be disposed directly on the substrate and preferably, a layer of an identical composition with that of the substrate is formed on the substrate as a buffer layer 2. Since the single crystals used for the substrate 1 usually have a number of defects and such defects reflect to the layer formed thereon and greatly lowers the performance as the semiconductor laser diode, the buffer layer 2 is disposed in order to inhibit these disadvantages.

The lower clad layer 3 is usually made of a material having a refractive index lower than that of the active layer 4. When GaAs is used for the buffer layer 2, an AlGaAs system ($Al_YGa_{1-Y}As$) is used for the lower clad layer 3, and the Al concentration may then be determined such that the refractive index of the lower clad layer 3 meets the above-described condition.

The active layer 4 is made of GaAs, AlGaAs, InGaAs, InGaAsP and other materials, and may have a structure such as various quantum well structures (SQW, MQW) comprising thin films of the above materials. The quantum well structure is ordinarily used in combination with optical guide layers. The optical guide layer arrangement used herein, for instance, may have an SCH structure wherein optical guide layers are formed on both sides of the active layer or a GRIN-SCH structure wherein the refractive index of an optical guide layer is continuously changed by the gradual changing of the composition of the optical guide layer. The material and structure of the active layer 4 may be determined depending on the desired center wavelength and output.

The first upper clad layer 5 is made of a material having a refractive index lower than that of the active layer 4. Then, the first upper clad layer 5 is usually identical in the refractive index with the lower clad layer 3. Thus, the first upper clad layer 5 is usually made of an AlGaAs system as in the case of the lower clad layer 3, and has the same Al concentration as in the lower clad layer 3. In this structure, it is the first upper clad layer 5 that corresponds to the layer comprising $Al_WGa_{1-W}As$.

The second etching stop layer 6 is made of an AlGaAs material, but it is usually preferable to use GaAs therefor. This is because MOCVD or other techniques can be used for the re-growth of the second upper clad layer, etc., on the second etching stop layer 6 with high quality of crystal. Usually, the second etching stop layer 6 has preferably a thickness of at least 2 nm.

The first etching stop layer 7 has a thickness of at least 5 nm, preferably at least 10 nm. At a thickness less than 5 nm, no sufficient inhibition of etching is achieved. The composition of this layer is represented by $In_VGa_{1-V}P$ or $Al_XGa_{1-X}As$. When $In_VGa_{1-V}P$ is used, V=0.5 is preferably used for a lattice matched for GaAs. However, $0 \leq V \leq 1$ except V=0.5 can also be used of a strained system. When $Al_XGa_{1-X}As$ is used, on the other hand, the value of X may be determined in view of $Al_YGa_{1-Y}As$ forming the current blocking layer and the condition of $X-Y \geq 0.1$, thereby achieving sufficient etching stop function.

The current blocking layer blocks currents or conducts no currents substantially. Therefore, the current blocking layer has the same conduction type as in the lower clad layer or be undoped. The current blocking layer has also preferably a refractive index lower than that of the second upper clad layer 8 ($Al_TGa_{1-T}As$). Hence, the Al concentration should preferably be given by Y>T.

The cap layer 10 is used as a protection layer for the current blocking layer 9 at the first growth step. The cap layer 10 also helps a growth of the second upper clad layer 8. A portion of the cap layer 10 is removed during the fabrication process. For removing portions of the cap and current blocking layers 10 and 9, an organic acid and an aqueous solution of hydrogen peroxide are used in a mixed form. In this case, the mixing ratio of the organic acid and the aqueous solution of hydrogen peroxide and the concentration of the aqueous solution may be determined by the materials of which the current blocking layer 9 and the first etching stop layer 7 are made. Although not critical, however, it is preferable that the mixing ratio of hydrogen peroxide to the organic acid is selected from the range of 1/10 to 1/50 (by weight). Then, the organic acid and hydrogen peroxide are used in an aqueous solution form having a concentration of 30 to 50% by weight. It is here to be noted that etching occurs usually at normal temperature. Furthermore, a portion of the first etching stop layer is removed using a second etching stop layer 6 as an etching stop layer.

Usually, the index of refraction of the second upper clad layer 8 is equal to, or lower than, that of the active layer 4. Usually, the second upper clad layer 8 is identical in the refractive index with the lower clad layer 3 and the first upper clad layer 5.

On the second upper clad layer 8 there is provided the contact layer 11 used for lowering the contact resistivity to the electrode. The contact layer 11 is usually made of a GaAs material. To lower the contact resistivity to the electrode, this layer usually has a carrier concentration higher than those of other layers.

Usually, the buffer layer 2 has a thickness selected from the range of 0.1 to 1 $\mu$m; the lower clad layer 3 has a thickness of 0.5 to 3 $\mu$m; the active layer 4 has a thickness of 0.005 to 0.02 $\mu$m per layer if it has a quantum well structure; the first upper clad layer 5 has a thickness of 0.05 to 0.3 $\mu$m; the second upper clad layer 8 has a thickness of 0.5 to 3 $\mu$m; the cap layer 10 has a thickness of 0.005 to 0.5 $\mu$m; and the current blocking layer 9 has a thickness of 0.3 to 2 $\mu$m.

The semiconductor laser diode shown in FIG. 1 further includes electrodes 12 and 13. The electrode 12, when it is of the p-type, is typically provided on the surface of the contact layer 11 by forming Ti/Pt/Au thereon in the described order by evaporation, followed by alloying treatments. On the other hand, the electrode 13, when it is of the n-type, is typically provided on the surface of the wafer 1 by forming AuGe/Ni/Au thereon in the described order by evaporation, followed by alloying treatments.

One example of the process for fabricating a semiconductor laser diode device according to the present invention will now be explained with reference to FIG. 1.

According to the present invention, the buffer layer 2, lower clad layer 3, active layer 4, first upper clad layer 5, second etching stop layer 6, first etching stop layer 7, current blocking layer 9 and cap layer 10 are grown over the substrate 1 using MOCVD, MBE, LPE or other techniques, depending to the thicknesses of the layers to be grown. After an SiNx or other mask is formed on the cap layer 10, portions of the current blocking layer 9 and cap layer 10 are removed by wet etching until the first etching stop layer 7 is exposed, thereby obtaining the desired structure.

In this step, any etchant which etches $Al_yGa_{1-y}As$ and does not etch $In_yGa_{1-y}P$ or $Al_xGa_{1-x}As$ can be used. When the first etching stop layer is made of $In_yGa_{1-y}P$, it is preferable to use a mixture of sulfuric acid and an aqueous solution of hydrogen peroxide as the etchant. Although what ratio they are mixed at is not critical, it is preferable that water account for at least 50% by volume of the etchant to control the etching rate. When the first etching stop layer is made of $Al_xGa_{1-x}As$, the mixing ratio of an organic acid and an aqueous solution of hydrogen peroxide is determined such that a portion of the current blocking layer of $Al_yGa_{1-y}As$ is etched away while $Al_xGa_{1-x}As$ remains intact. The etchant preferable to this end is a mixture of tartaric acid and an aqueous solution of hydrogen peroxide. In this case, the mixed ratio of the tartaric acid and the aqueous solution of hydrogen peroxide is selected suitable for the value of X and Y. However, it is preferable that water accounts for at least 50% by volume of the etchant to control the etching rate.

Once the first etching stop layer has been exposed by etching, only an exposed portion of the first etching stop layer is etched away. The etchant used herein should not etch the materials forming the second etching stop, current blocking layer and cap layers.

For this etchant, for instance, use may be made of low-concentration hydrochloric acid, hot hydrochloric acid, and hot phosphoric acid. More specifically, when the first etching stop layer is made of $In_yGa_{1-y}P$, the first etching stop layer alone can be selectively etched away by use of low-concentration hydrochloric acid. Then, the current blocking layer 9 functions as an etching mask for the first etching stop layer 7, so that high precision control of transverse dimensions can be achieved with no side-etching. When the first etching stop layer 7 is made of $Al_xGa_{1-x}As$, on the other hand, $Al_xGa_{1-x}As$ where $X \geq 0.5$ can be selectively etched away by use of hot hydrochloric acid, hot phosphoric acid or the like.

The second upper clad layer 8 and the contact layer 11 are then formed thereon again by an epitaxial growth technique, followed by the formation of the electrode on the contact layer 11. The thus fabricated semiconductor wafer is divided into chips for use as a laser diode (LD). While the present invention has been described typically with reference to a laser diode, it is to be understood that the present invention is applicable to various semiconductor devices required to have a precise ridge or groove shape, inclusive of light emitting diode (LED).

By way of example, the present invention will now be explained at great length.

EXAMPLE 1

The laser diode with a groove current injection area, shown in FIG. 1, was fabricated. This fabrication process will now be explained with reference to FIGS. 2 to 6.

Figure 2:
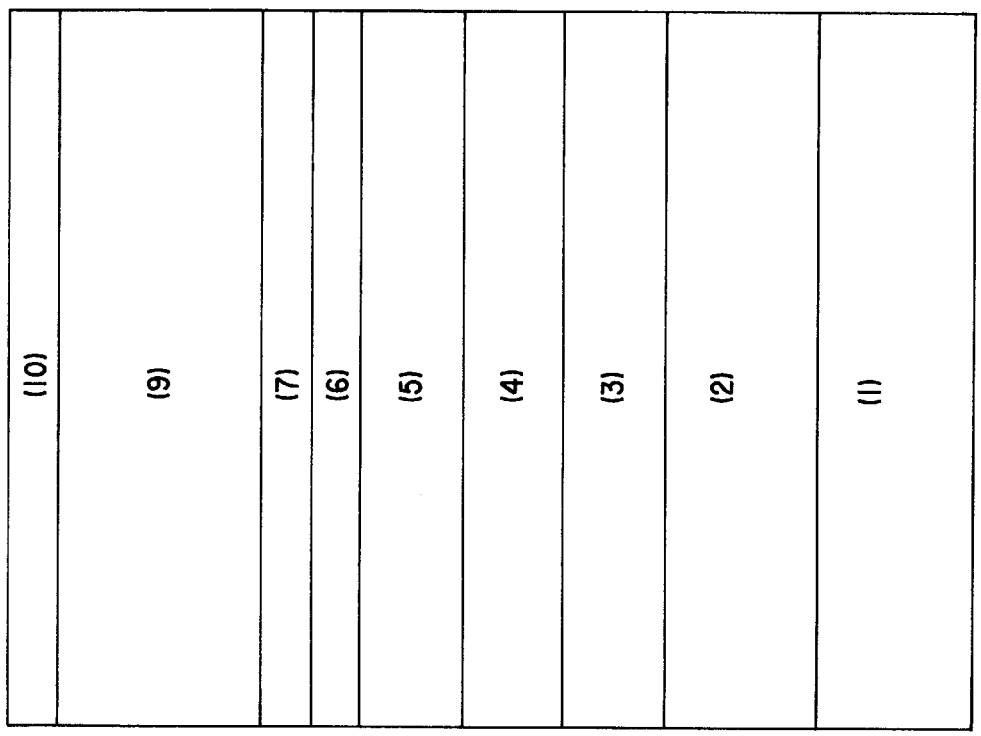
FIG. 2 is a schematic of the process of fabricating the semiconductor laser diode shown in FIG. 1.

A buffer layer 2 or an n-type GaAs layer having a thickness of 1 $\mu$m and a carrier concentration of $1 \times 10^{18}$ cm$^{-3}$, a lower clad layer 3 or an n-type $Al_{0.35}Ga_{0.65}As$ layer having a carrier concentration of $5 \times 10^{17}$ cm$^{-3}$, an active layer 4 or a layer having a single quantum well (SQW) structure of undoped $In_{0.2}Ga_{0.8}As$ of 6 nm in thickness and sandwiched between undoped GaAs optical guide layers of 60 nm in thickness, a first upper clad layer 5 to a p-type of $Al_{0.35}Ga_{0.65}As$ layer having a thickness of 0.1 $\mu$m and a carrier concentration of $5 \times 10^{17}$ cm$^{-3}$, a second etching stop layer 6 or a p-type GaAs layer having a thickness of 10 nm and a carrier concentration of $5 \times 10^{17}$ cm$^{-3}$, a first etching stop layer 7 or an n-type $In_{0.5}Ga_{0.5}P$ layer having a thickness of 20 nm and a carrier concentration of $5 \times 10^{17}$ cm$^{-3}$, a current blocking layer 9 or an n-type $Al_{0.4}Ga_{0.6}As$ layer having a thickness of 0.7 $\mu$m and a carrier concentration of $5 \times 10^{17}$ cm$^{-3}$ and a cap layer 10 or an n-type GaAs layer having a thickness of 10 nm and a carrier concentration of $5 \times 10^{17}$ cm$^{-3}$ were gown on the wafer 1 or an n-type GaAs wafer having a carrier concentration of $1 \times 10^{18}$ cm$^{-3}$ in the described order by an MBE technique (FIG. 2).

Figure 4:
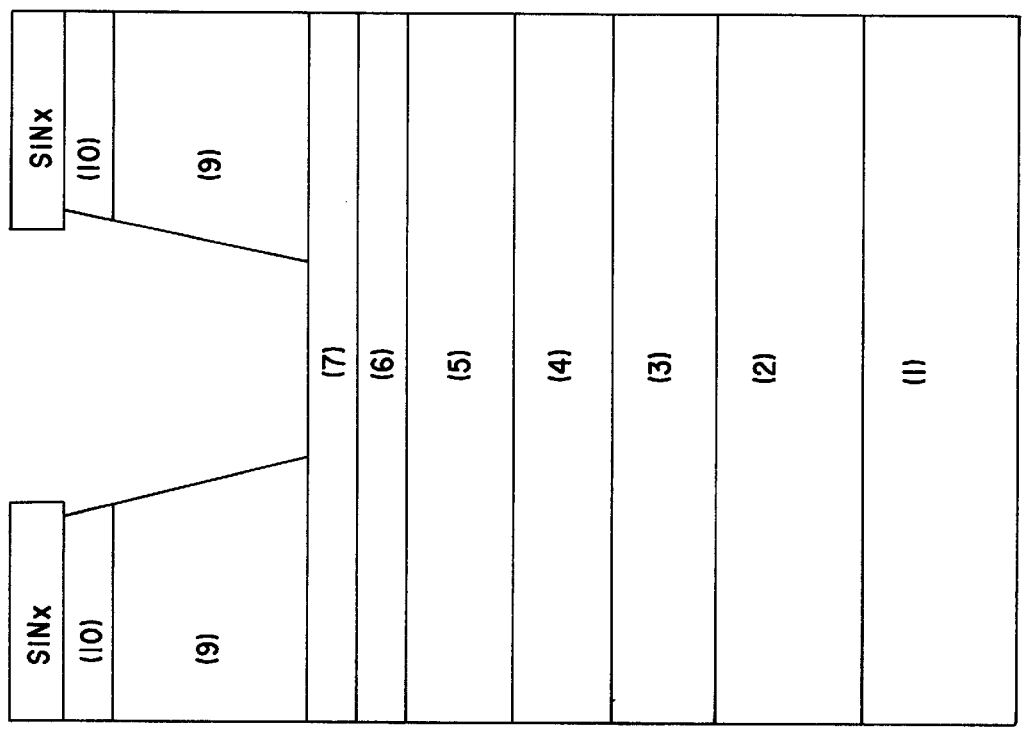
FIG. 4 is a schematic of the process of fabricating the semiconductor laser diode shown in FIG. 1.

With a silicon nitride mask deposited on place (FIG. 3), etching was carried out using the first etching stop layer as an etching stop layer (FIG. 4). The etchant used herein was a mixture of sulfuric acid (98 wt %), hydrogen peroxide (a 30 wt % aqueous solution) and water at a volume ratio of 1:1:5, and the etching temperature and time were 25° C. and 30 seconds, respectively.

Figure 5:
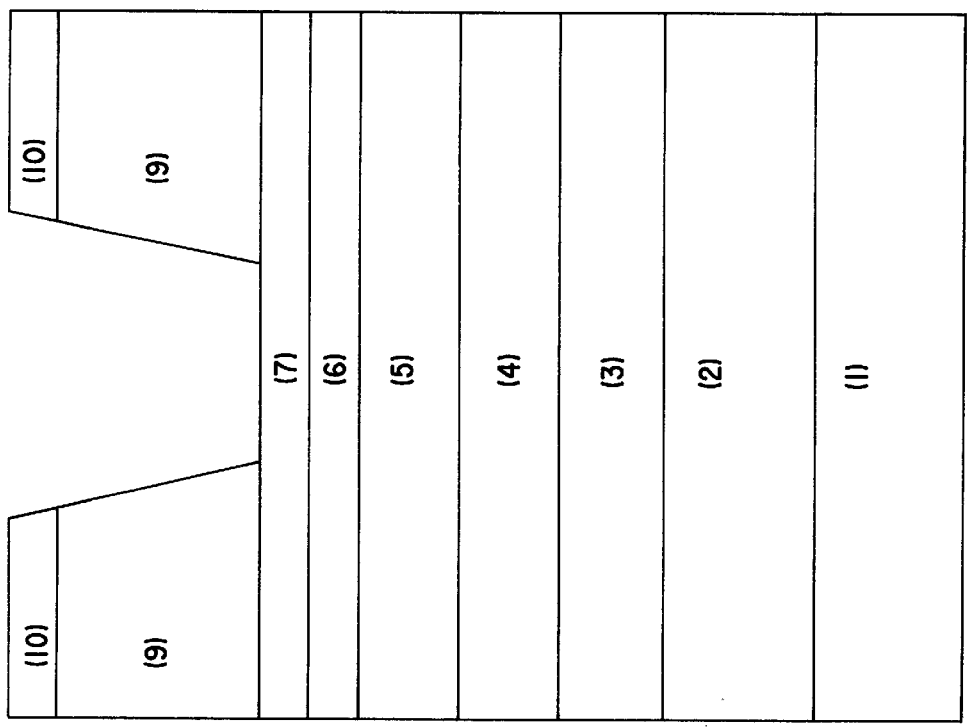
FIG. 5 is a schematic of the process of fabricating the semiconductor laser diode shown in FIG. 1.
Figure 6:
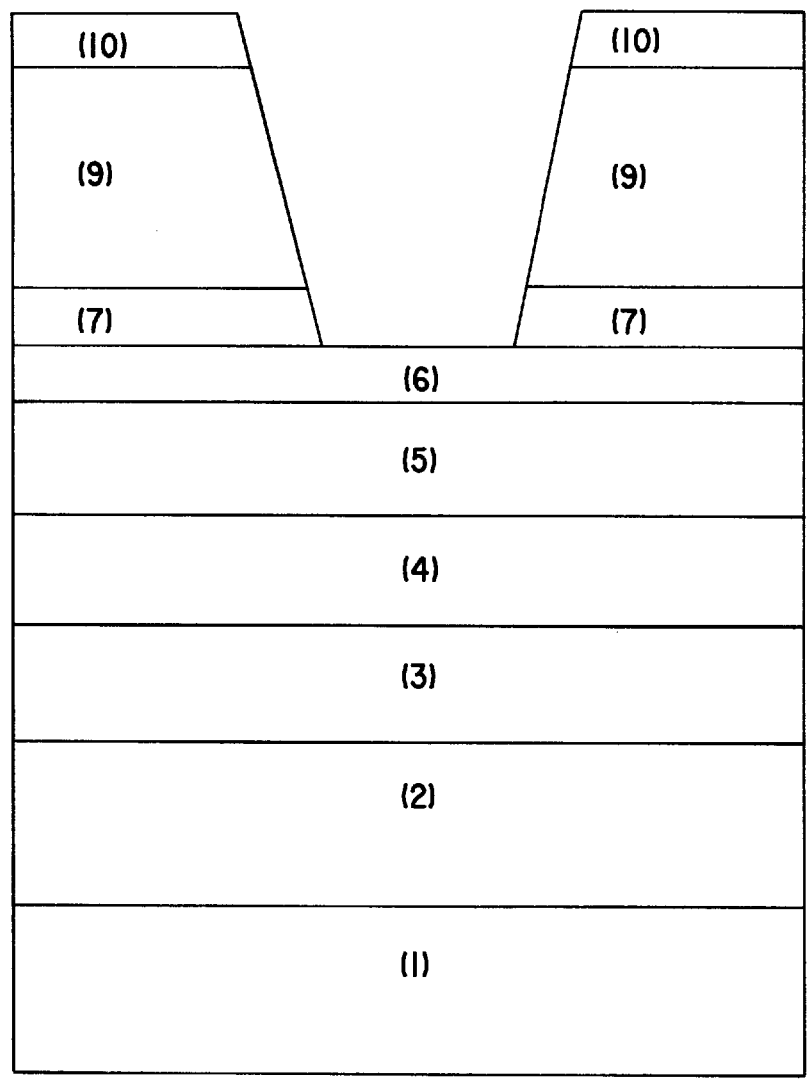
FIG. 6 is a schematic of the process of fabricating the semiconductor laser diode shown in FIG. 1.

Then, the assembly was dipped in an etchant obtained by mixing HF (49%) and NH$_4$F (40%) at 1:6 for 150 seconds to remove the silicon nitride layer (FIG. 5). The first etching stop layer was further etched using the second etching stop layer as an etching stop layer (FIG. 6). The etchant used herein was a mixture of hydrochloric acid (35 wt %) and water at 2:1, and the etching temperature and time were 25° C. and 2 minutes, respectively.

Figure 7:
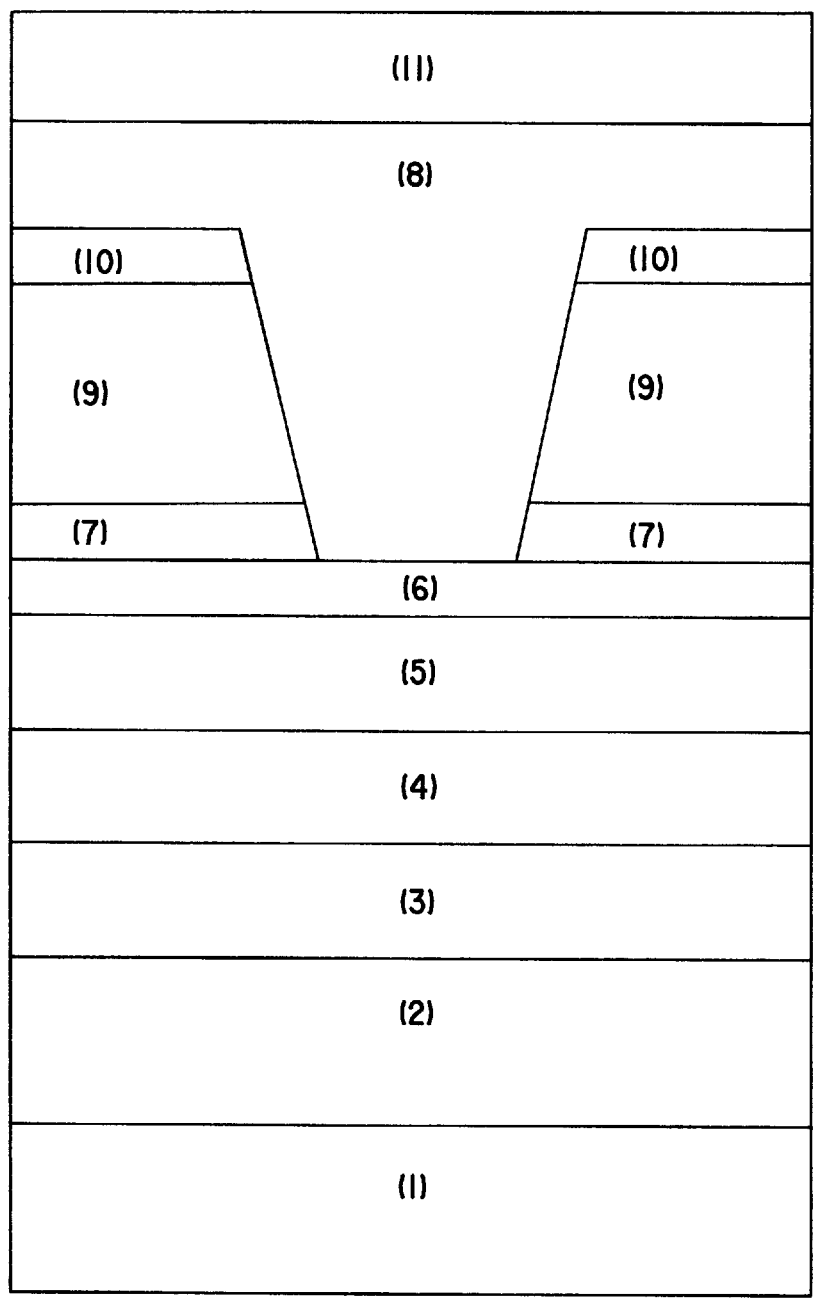
FIG. 7 is a schematic of the process of fabricating the semiconductor laser diode shown in FIG. 1.

After this, a second upper clad layer θ or a p-type Al$_{0.35}$Ga$_{0.65}$As layer having a carrier concentration of $1\times10^{18}$ cm$^{-3}$ was grown in the opening at a thickness of 1.5 μm by an MOCVD technique, and a contact layer 11 to maintain good-enough contact with the electrode or a p-type GaAs layer having a thickness of 2 μm and a carrier concentration of $1\times10^{19}$ cm$^{-3}$ was finally gown (FIG. 7), thereby forming a semiconductor laser diode.

EXAMPLE 2

Another laser diode was fabricated following Example 1 with the exception that:

the thicknesses of the undoped GaAs guide layers were changed to 40 nm, a p-type Al$_{0.38}$Ga$_{0.62}$As layer was used as the first upper clad layer 5, an n-type Al$_{0.58}$Ga$_{0.42}$As layer was used as the first etching stop layer 7, using the first etching stop layer as an etching stop layer, etching was carried out with an etchant obtained by mixing together tartaric acid (50 wt %) and hydrogen peroxide (an 30 wt %) aqueous solution) at a volume ratio of 2:1 at 25° C. for 120 seconds, using the second etching stop layer as an etching stop layer, etching was carried out with an etchant consisting of hydrochloric acid (35 wt %) at 75° C. for 1 minute, and the thickness of the contact layer 11 was changed to 3 μm.

EXAMPLE 3

Figure 8:
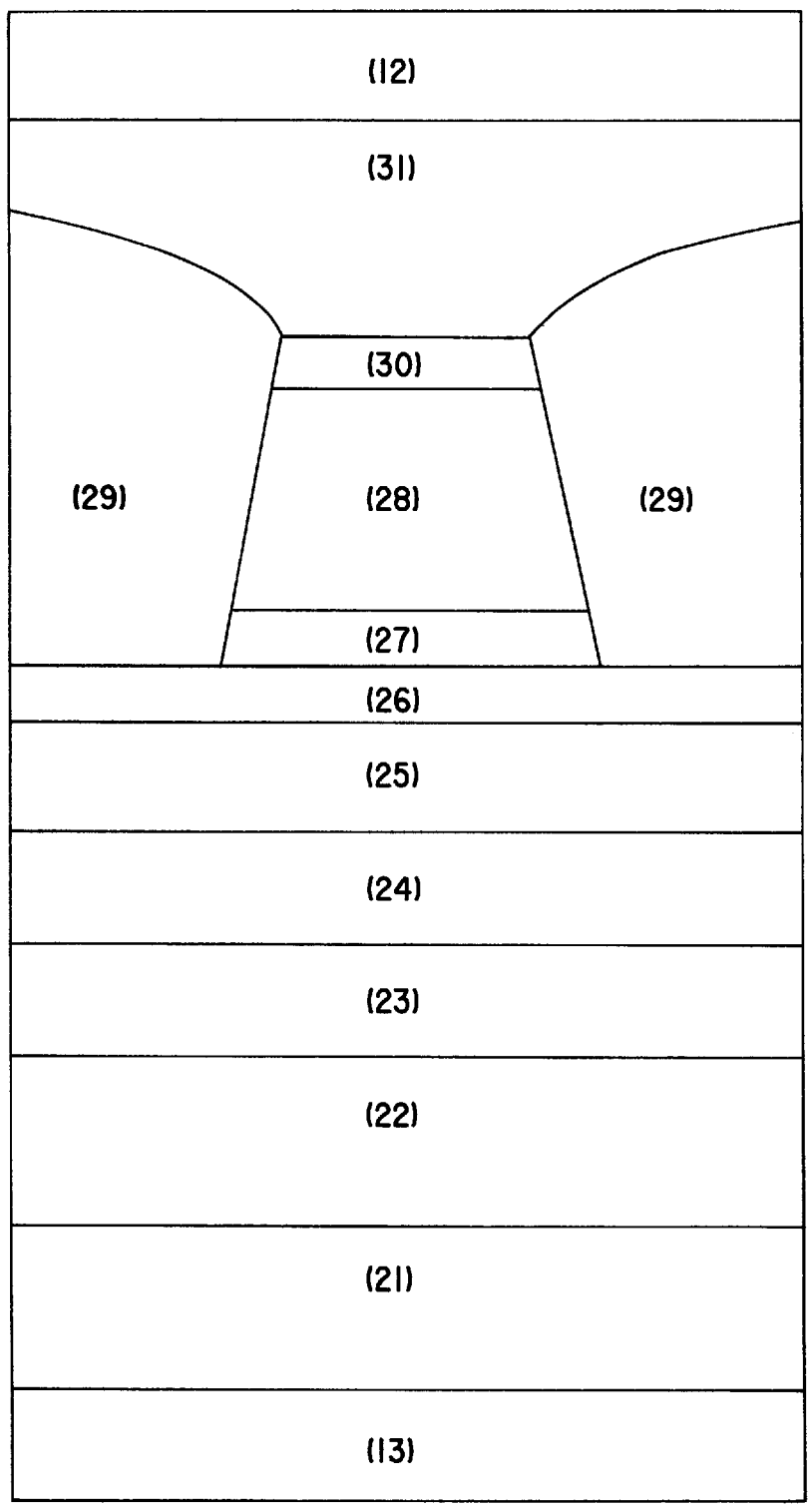
FIG. 8 is a schematic of one example of the ridged epitaxial structure of the semiconductor laser diode according to the present invention.

The laser diode with a ridge current injection area, shown in FIG. 8, was fabricated. This fabrication process will now be explained with reference to FIGS. 9 to 15.

Figure 9:
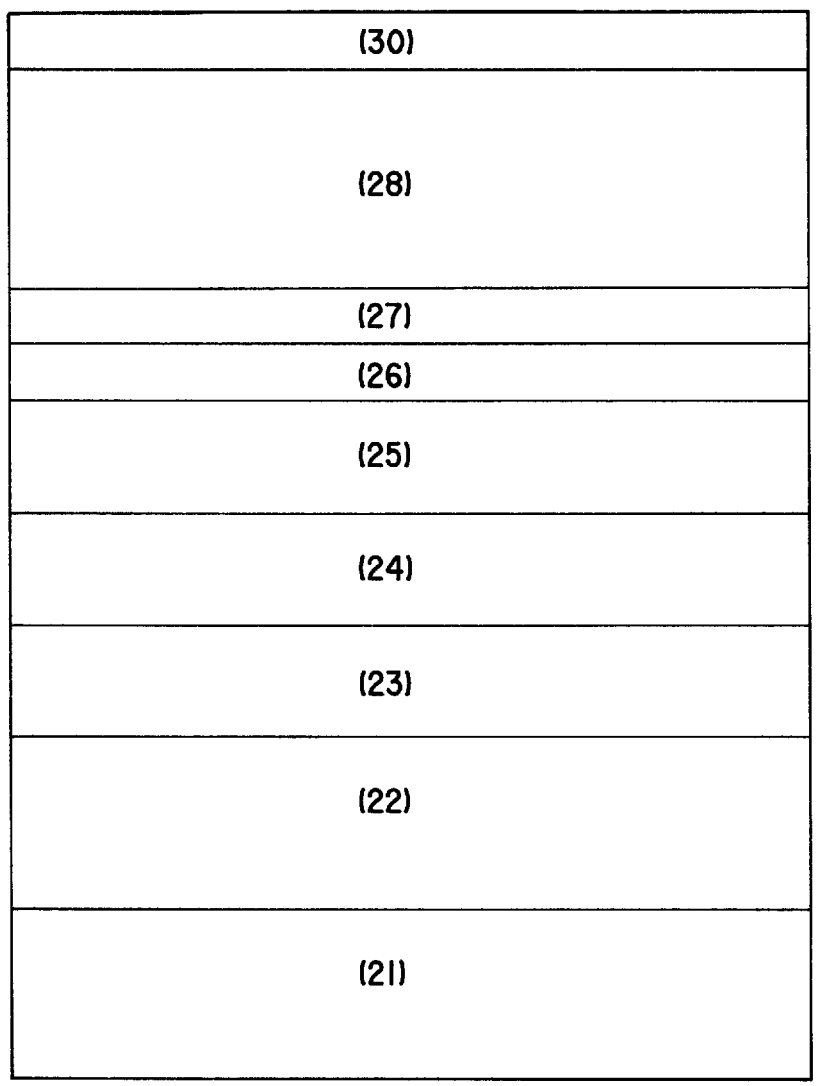
FIG. 9 is a schematic of the process of fabricating the semiconductor laser diode shown in FIG. 8.

A buffer layer 22 or an n-type GaAs layer having a thickness of 1 μm and a carrier concentration of $1\times10^{18}$ cm$^{-3}$, a lower clad layer 23 or an n-type Al$_{0.35}$Ga$_{0.65}$As layer having a carrier concentration of $5\times10^{17}$ cm$^{-3}$, an active layer 24 or a layer having a single quantum well (SQW) structure of undoped In$_{0.2}$Ga$_{0.8}$As of 6 nm in thickness and sandwiched between undoped GaAs guide layers of 60 nm in thickness, a first upper clad layer 25 or a p-type of Al$_{0.35}$Ga$_{0.65}$As layer having a thickness of 0.1 μm and a carrier concentration of $5\times10^{17}$ cm$^{-3}$, a second etching stop layer 26 or a p-type GaAs layer having a thickness of 10 nm and a carrier concentration of $5\times10^{17}$ cm$^{-3}$, a first etching stop layer 27 or a p-type In$_{0.5}$Ga$_{0.5}$P layer having a thickness of 20 nm and a carrier concentration of $5\times10^{17}$ cm$^{-3}$, a second upper clad layer 28 or a p-type Al$_{0.35}$Ga$_{0.65}$As layer having a thickness of 1 μm and a carrier concentration of $1\times10^{18}$ cm$^{-3}$, and a cap layer 30 or a p-type GaAs layer having a thickness of 10 nm and a carrier concentration of $5\times10^{17}$ cm$^{31\ 3}$ were deposited on the wafer 21 or an n-type GaAs wafer having a carrier concentration of $1\times10^{18}$ cm$^{-3}$ in the described order by an MBE technique (FIG. 9).

Figure 11:
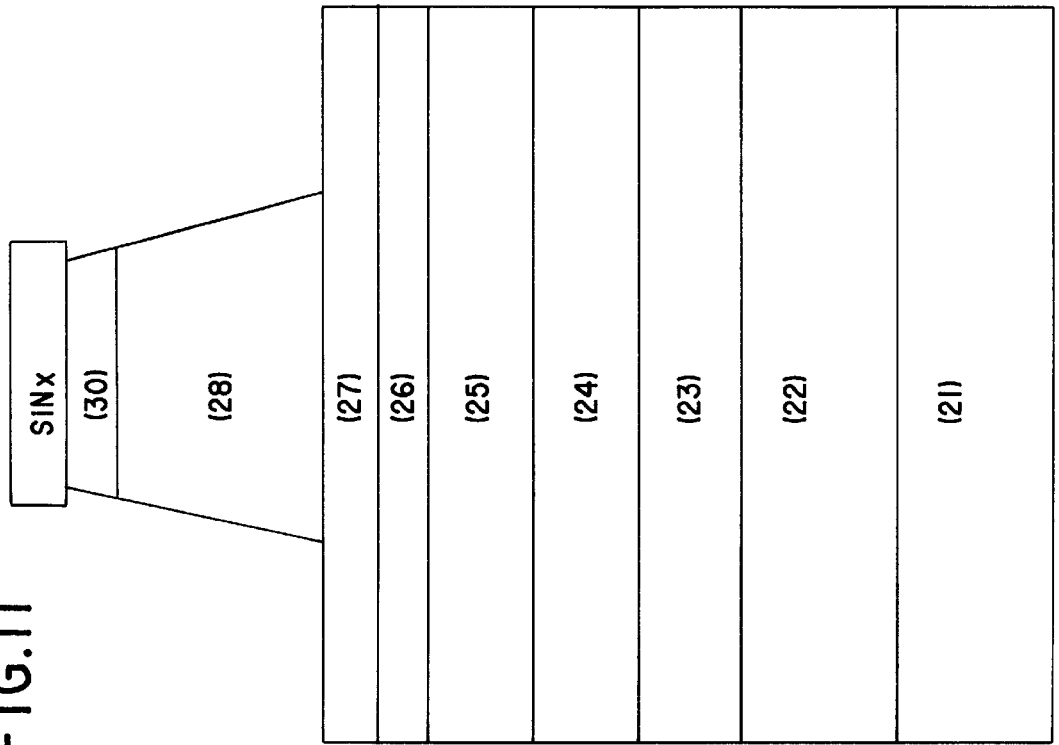
FIG. 11 is a schematic of the process of fabricating the semiconductor laser diode shown in FIG. 8.
Figure 10:
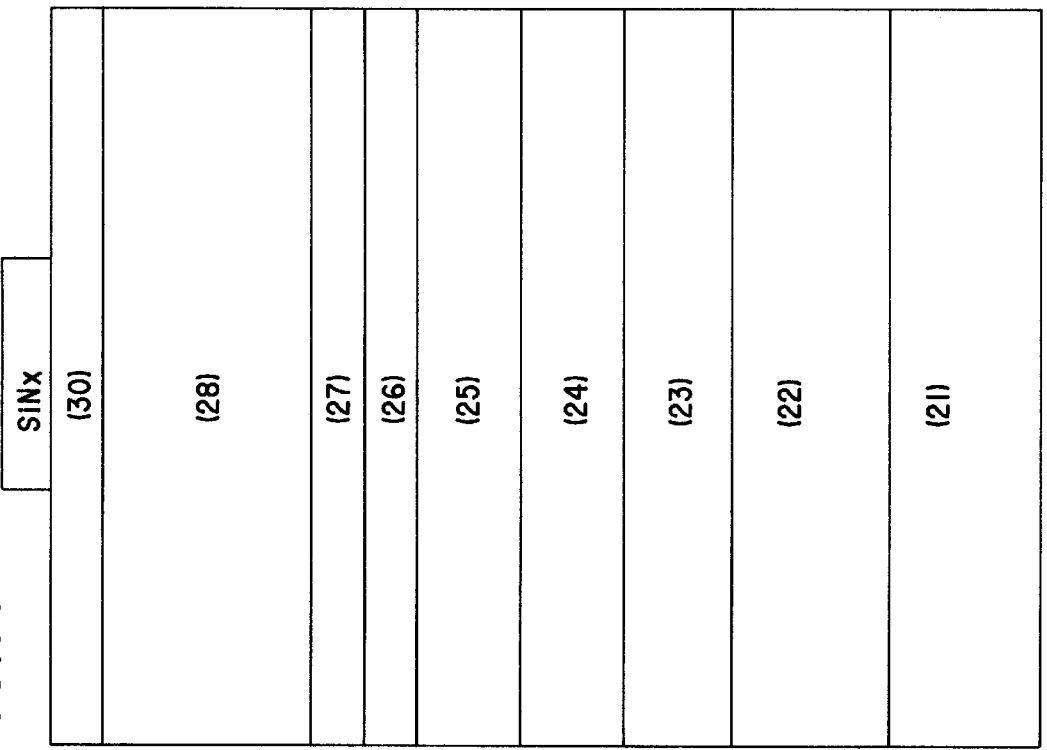
FIG. 10 is a schematic of the process of fabricating the semiconductor laser diode shown in FIG. 8.

With a silicon nitride mask deposited on place (FIG. 10), etching was carried out using the first etching stop layer as an etching stop layer (FIG. 11). The etchant used herein was a mixture of sulfuric acid (98 wt %), hydrogen peroxide (a 30 wt % aqueous solution) and water at a volume ratio of 1:1:5, and the etching temperature and time were 25° C. and 30 seconds, respectively.

Figure 12:
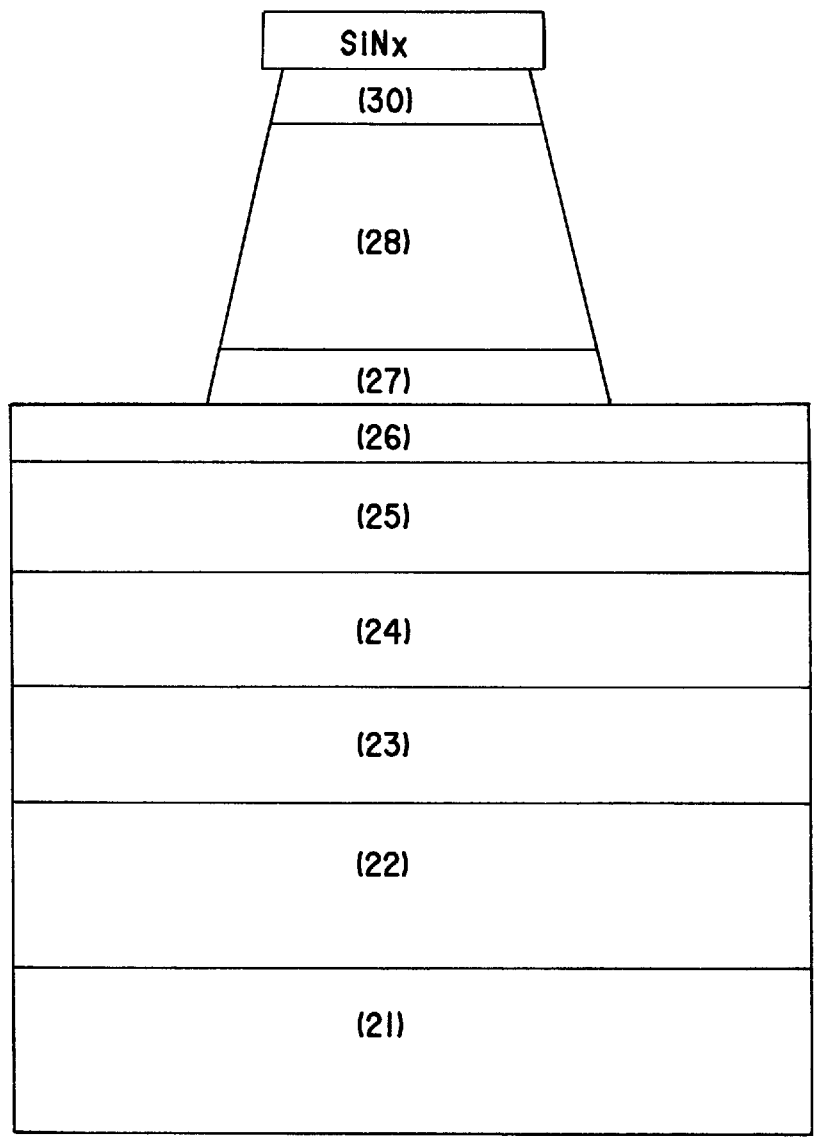
FIG. 12 is a schematic of the process of fabricating the semiconductor laser diode shown in FIG. 8.

Furthermore, the first etching stop layer was etched away using the second etching stop layer as an etching stop layer (FIG. 12). The etchant used herein was a mixture of hydrochloric acid (35 wt %) and water at 2:1, and the etching temperature and time were 25° C. and 2 minutes, respectively.

Figure 13:
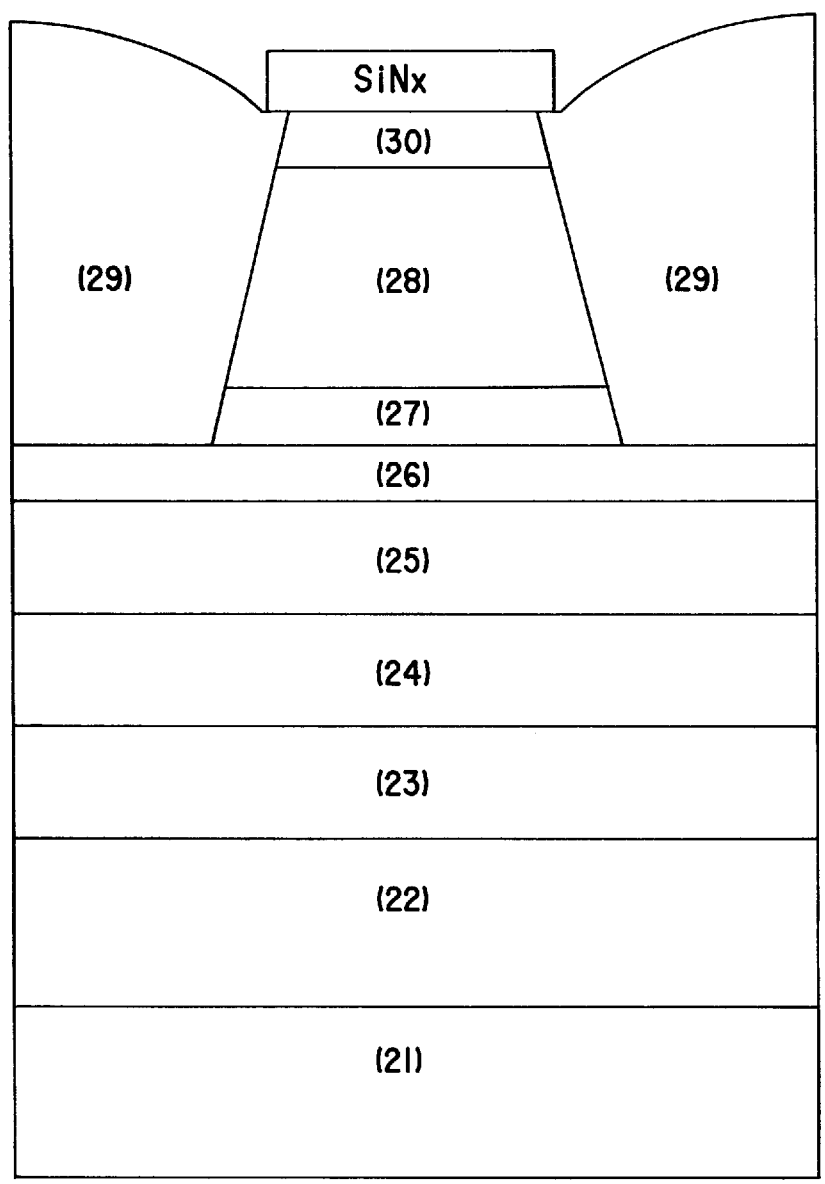
FIG. 13 is a schematic of the process of fabricating the semiconductor laser diode shown in FIG. 8.
Figure 14:
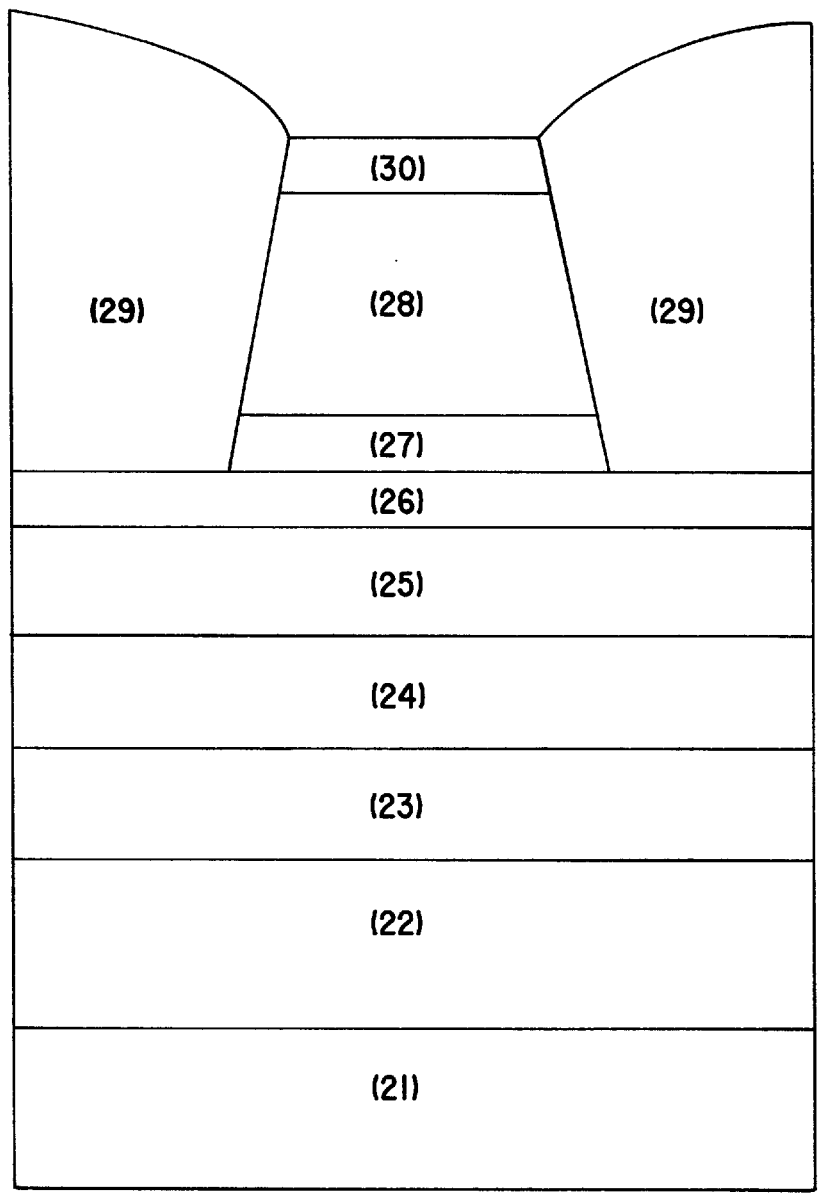
FIG. 14 is a schematic of the process of fabricating the semiconductor laser diode shown in FIG. 8.
Figure 15:
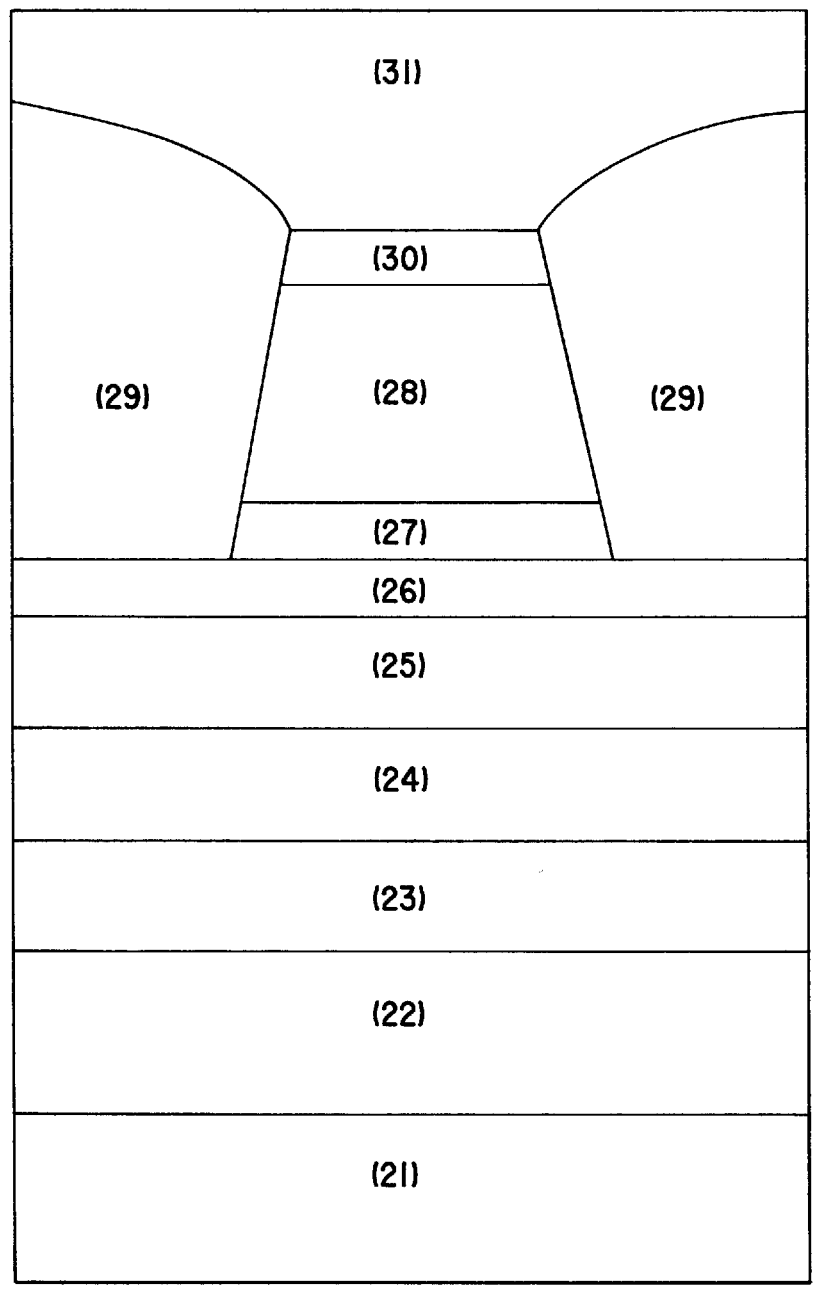
FIG. 15 is a schematic of the process of fabricating the semiconductor laser diode shown in FIG. 8.

After this, an n-type Al$_{0.4}$Ga$_{0.6}$As layer having a thickness of 1.5 μm and a carrier concentration of $5\times10^{17}$ cm$^{-3}$ was grown in the form of a current blocking layer 29 by an MOCVD technique (FIG. 13). Following this, silicon nitride was removed by a plasma etching technique using SF$_6$ (FIG. 14). A p-type GaAs layer having a thickness of 2 μm and a carrier concentration of $1\times10^{19}$ cm$^{-3}$ was grown in the form of a contact layer 31 again by an MOCVD technique (FIG. 15), thereby forming a laser diode.

EXAMPLE 4

Another laser diode was fabricated following Example 3 with the exception that:

A p-type Al$_{0.58}$Ga$_{0.42}$As layer was used as the first etching stop layer 27, using the first etching stop layer as an etching stop layer, etching was carried out with an etchant obtained by mixing together tartaric acid (50 wt %) and hydrogen peroxide (an 30 wt % aqueous solution) at a volume ratio of 2:1 at 25° C. for 120 seconds, and using the second etching stop layer as an etching stop layer, etching was carried out with an etchant consisting of hydrochloric acid (35 wt %) at 75° C. for 1 minute.

According to the present invention as explained above, the versatility of a semiconductor element having a ridge or groove can be much more exploited than ever before, and the ridge or groove of any desired shape can precisely be formed by the wet etching of a layer comprising Al$_y$Ga$_{1-y}$As having any desired Al concentration. In addition, since the re-growing interface for re-growth can be GaAs, it is possible to improve the quality of crystal of the re-grown portion.

What we claim is:

1. A semiconductor device including a substrate and, on said substrate in the following described order, at least:

(a) a layer comprising at least Al$_w$Ga$_{1-w}$As;

(b) a second etching stop layer comprising AlGaAs or GaAs;

(c) a first etching stop layer in contact with said second etching stop layer;

(d) a layer comprising Al$_y$Ga$_{1-y}$As wherein a portion of (c) said first etching stop layer and a portion of (d) said layer comprising at least Al$_y$Ga$_{1-y}$As are removed, said device further including:

(e) a layer comprising AlGaAs at the removed portions of said layers (c) and (d);

one of said layer (d) and said layer (e) being a current blocking layer and other of said layer (d) and said layer (e) being a clad layer, the current blocking layer having a lower refractive index than the clad layer.

2. The semiconductor device according to claim 1, wherein said second etching stop layer comprises GaAs and said first etching stop layer comprises $Al_xGa_{1-x}As$, and which conforms to the following condition:

$$X-Y>0.1$$

3. The semiconductor device according to claim 1, wherein said second etching stop layer comprises $Al_zGa_{1-z}As$ or GaAs and said first etching stop layer comprises $In_VGa_{1-V}P$.

4. A semiconductor device including a substrate and, on said substrate in the following described order, at least:
   (a) a layer comprising at least $Al_wGa_{1-w}As$;
   (b) a second etching stop layer comprising AlGaAs or GaAs;
   (c) a first etching stop layer in contact with said second etching stop layer;
   (d) a layer comprising $Al_yGa_{1-y}As$;

wherein (c) said first etching stop layer acts as an etching stop layer when (d) said layer comprising $Al_yGa_{1-y}As$ is etched, and (b) said second etching stop layer acts as an etching stop layer when (c) said first etching stop layer is etched, and wherein a portion of (c) said first etching stop layer and a portion of (d) said layer comprising at least $Al_yGa_{1-y}As$ are removed, said device further including:
   (e) a layer comprising AlGaAs at the removed portions of said layers (c) and (d);
   one of said layer (d) and said layer (e) being a current blocking layer and other of said layer (d) and said layer (e) being a clad layer, the current blocking layer having a lower refractive index than the clad layer.

* * * * *